(12) United States Patent
Qu et al.

(10) Patent No.: US 12,494,797 B2
(45) Date of Patent: Dec. 9, 2025

(54) SYSTEM AND METHOD FOR ANALOG-TO-DIGITAL CONVERTER (ADC) WITH REPRESSED INPUT CURRENT

(71) Applicant: Avago Technologies International Sales Pte. Limited, Singapore (SG)

(72) Inventors: Gen Qu, Irvine, CA (US); Hans Eberhart, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 137 days.

(21) Appl. No.: 18/425,613

(22) Filed: Jan. 29, 2024

(65) Prior Publication Data

US 2025/0247106 A1 Jul. 31, 2025

(51) Int. Cl.
*H03M 1/00* (2006.01)
*H03M 1/46* (2006.01)

(52) U.S. Cl.
CPC ........... *H03M 1/466* (2013.01); *H03M 1/462* (2013.01)

(58) Field of Classification Search
CPC ...... H03M 1/466; H03M 1/403; H03M 1/442; H03M 1/34

USPC ................. 341/126, 144, 155, 172
See application file for complete search history.

(56) References Cited

U.S. PATENT DOCUMENTS

| | | | |
|---|---|---|---|
| 6,025,794 A * | 2/2000 | Kusumoto | H03M 1/1245 341/172 |
| 7,504,974 B2 * | 3/2009 | Iriguchi | H03K 17/005 341/139 |
| 2023/0387929 A1* | 11/2023 | Sedighi | H03M 1/0854 |

\* cited by examiner

*Primary Examiner* — Peguy Jean Pierre
(74) *Attorney, Agent, or Firm* — Foley & Lardner LLP

(57) ABSTRACT

A system includes an amplifier to receive a signal, an analog-to-digital converter (ADC), a first switch coupled to a capacitor to receive an output from the amplifier, the capacitor to provide the output to the ADC, a second switch coupled between the capacitor and the ADC to turn on/off the ADC, a third switch coupled between the amplifier and the first switch to connect/disconnect the output to/from the first switch, a fourth switch coupled between the amplifier and the first switch to bypass the amplifier, and circuitry. The circuitry turns on the first switch and the second switch to initiate charging the capacitor, turns on the fourth switch and turns off the third switch to complete the charging, and turns off the second switch and the first switch to control the ADC to convert the output to a digital signal.

20 Claims, 7 Drawing Sheets

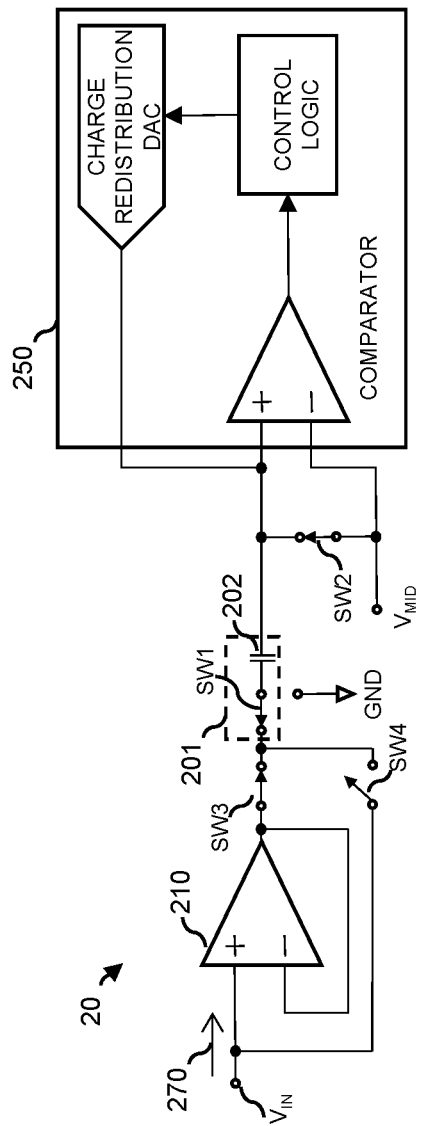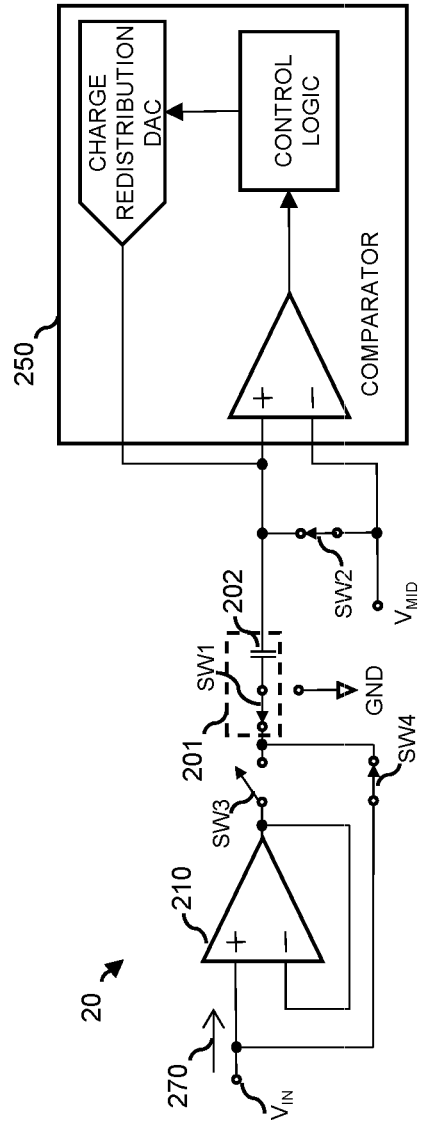

SYSTEM AND METHOD FOR ANALOG-TO-DIGITAL CONVERTER (ADC) WITH REPRESSED INPUT CURRENT

FIELD OF THE DISCLOSURE

This disclosure generally relates to systems and methods for analog-to-digital converters (ADCs), and more particularly to capacitive ADCs implemented with successive approximation registers (SARs).

BACKGROUND

In integrated circuits, an ADC (e.g., capacitive SAR ADC) can be implemented. By operating switches and capacitors, a capacitive ADC can convert an analog signal into a digital signal. However, the performance of the ADC can be susceptible to non-linearity caused by the operation of the switches.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 4 to FIG. 8 is a schematic diagram of the system shown in FIG. 2A at a certain time shown in the timing chart in FIG. 3 in accordance with some embodiments.

Figure 1:
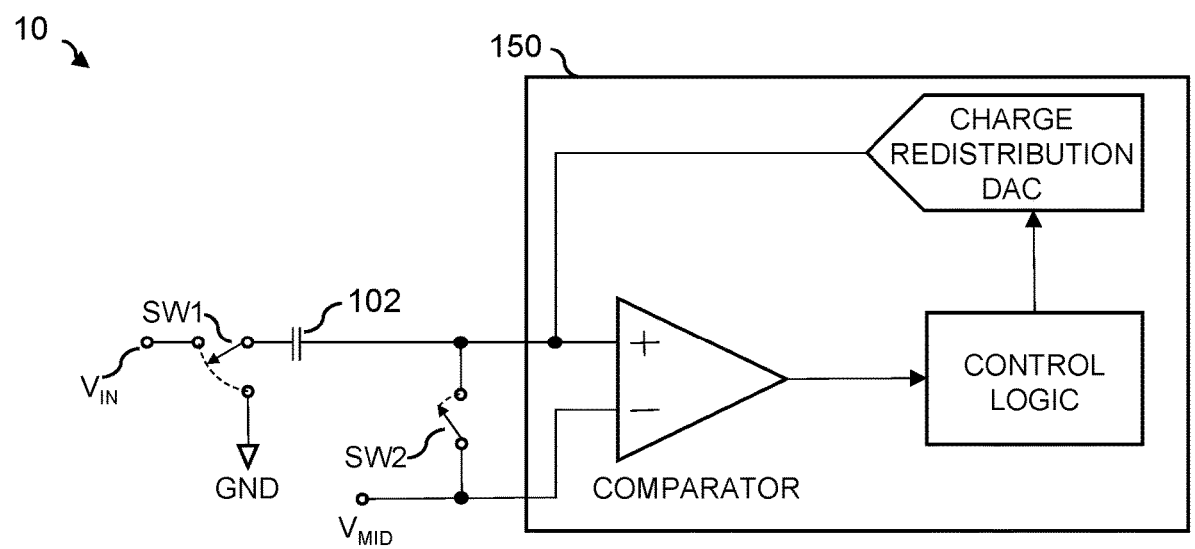
FIG. 1 is a schematic diagram of a traditional system.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a system, a device, circuitry, or a method, including an amplifier, an analog-to-digital converter (ADC), switches, and control circuitry.

In some embodiments, the ADC may be or include a system, a device, or any circuit component to convert an analog signal into a digital signal. For example, the ADC can convert a continuous analog signal into a digital representation or data for processing. In some embodiments, the ADC may be or include a capacitive ADC and can convert an analog signal into a digital signal based on operations of switches and a capacitor. For example, the capacitor can be charged or discharged for the ADC to perform the analog-to-digital conversion. In some embodiments, the ADC may be or include a successive approximation register (SAR) ADC. The SAR ADC may be any ADC that can convert a continuous analog waveform into a discrete digital representation using a binary search through all possible quantization levels. The ADC can iteratively approximate an input analog voltage to perform the analog-to-digital conversion. In some embodiments, the ADC can successively compare an input voltage with a reference voltage, and can iteratively determine a closest approximation of the input voltage. In some embodiments, the ADC can include a comparator, a control logic, a charge redistribution digital-to-analog converter (DAC), etc. For example, the ADC can include a DAC configured to redistribute electric charges between different capacitors and output an analog voltage. The ADC can include a DAC configured to generate an analog output voltage by redistributing charges across capacitors each of which corresponds to a digital input.

In some embodiments, the amplifier may be or include an amplifier module, an operational amplifier, or any other component to receive an input signal and scale or adjust the input signal to a predetermined level. For example, the amplifier can increase or decrease an amplitude of an input signal to a level corresponding to the ADC. In some embodiments, the amplifier can receive a first signal from an input node (e.g., input terminal). In some embodiments, the amplifier can serve as a buffer between the first switch and the input node. The first signal may be or include an analog input signal, an analog input voltage, or any analog signal for the ADC to generate a digital signal. The first signal can be provided through the input node.

The switches may include a first switch, a second switch, a third switch, and a fourth switch. In some embodiments, each of the switches may be or include any semiconductor device (e.g., a Bipolar Junction Transistor (BJT), a Metal-Oxide-Semiconductor Field-Effect Transistor (MOSFET), etc.), any semiconductor diode, any semiconductor switch, or any component that can control a current flow of a corresponding path that the switch is coupled to.

In some embodiments, the first switch can be coupled to the capacitor and can control a flow of an output signal from the amplifier. For example, when the first switch is on (e.g., closed), the first switch can receive an output signal from the amplifier and send the output signal through the capacitor. When the first switch is off (e.g., open), the first switch can prevent the output signal from the amplifier from flowing through the capacitor. The capacitor can provide, responsive to the first switch, the output signal as input to the ADC.

In some embodiments, the capacitor may be or include any electronic component to store electrical energy. For example, the capacitor can charge or discharge electric charge according to at least one of the switches. In some embodiments, the output signal may be or include a signal amplified by the amplifier. For example, the amplifier can amplify the first signal, and the capacitor can receive the first signal that has been amplified by the amplifier according to the first switch. In some embodiments, the output signal may be or include an analog signal input to the ADC, which then can convert the input into a digital signal.

In some embodiments, the first switch and the capacitor can be connected in series, and can be coupled in parallel to a plurality of pairs including a respective switch and a respective capacitor. That is, in some embodiments, the first switch may refer to a plurality of first switches, and the capacitor may refer to a plurality of capacitors, each of which is coupled to a corresponding one of the plurality of first switches. In some embodiments, the first switch and the capacitor may be or include an array of the first switches and the capacitors.

In some embodiments, the second switch can be coupled between the capacitor and the ADC. The second switch can control an on/off status of the ADC. For example, the second switch can turn on the ADC (e.g., when the second switch is on or closed). The second switch can turn off the ADC (e.g., when the second switch is off or open).

In some embodiments, the third switch can be coupled between an output of the amplifier and the first switch. The third switch can control a connection between the first switch and the output signal of the amplifier. For example, the third switch can connect the output signal to the first switch (e.g., when the third switch is on or closed). The third switch can disconnect the output signal from the first switch (e.g., when the third switch is off or open).

In some embodiments, the fourth switch can be coupled between an input of the amplifier and the first switch. For example, the fourth switch can be coupled between an input terminal of the amplifier and the first switch. The fourth switch can be coupled between the input terminal for inverting input and the first switch. The fourth switch can control a connection between the input of the amplifier and the first switch. The fourth switch can connect the input of the amplifier and the first switch (e.g., when the fourth switch is on or closed). The fourth switch can disconnect the input of the amplifier and the first switch (e.g., when the fourth switch is off or open). In some embodiments, the fourth switch can bypass the amplifier (e.g., cause an analog input signal to bypass the amplifier). In some embodiments, each of the third switch and the fourth switch can have an impedance that is larger than an impedance of the first switch. For example, each of the third switch and the fourth switch can have an impedance that is larger than an impedance of the first switch, regardless of an operating status (e.g., on/off) of the switches. As discussed in greater detail below, operating the third switch and the fourth switch after pre-charging the capacitor allows for the capacitor to be charged to a voltage substantially equal to the first signal (or at least a voltage equal to a voltage of the first signal) such that a noise (e.g., due to at least one of offset, nonlinearity or distortion of the amplifier) can be reduced (e.g., removed).

In some embodiments, the control circuitry may be or include a circuit, circuitry, a controller, or any component that can control at least one of the switches. For example, the control circuitry can be coupled to the switches to control an on/off status of the first, second, third, or fourth switches. The control circuitry can control the switches in various modes. The control circuitry can control the switches in an acquisition mode of the ADC such that the ADC can charge the capacitor to sample an input analog signal to be converted to a digital signal. The control circuitry can control the switches in a conversion mode of the ADC such that the ADC can convert the analog input signal to a digital output signal based on the charges in the capacitor. For example, in the conversion mode, a successive approximation can be used to convert the input analog signal to the digital output signal. The capacitor voltage can be compared to a reference voltage, sequentially being approximated to output the digital output signal. The control circuitry can control the switches to operate alternately in the acquisition mode and the conversion mode.

In some embodiments, the control circuitry can initiate charging of the capacitor by turning on the first switch and the second switch with the third switch being on and the fourth switch being off, thereby feeding a buffered input to the capacitor. In some embodiments, an acquisition mode can begin by turning on the first switch and the second switch with the third switch being on and the fourth switch being off. That is, the capacitor can be charged by the first signal that has passed the amplifier. In some embodiments, a predetermined time can be given to settle the capacitor (e.g., charging up the capacitor). In some embodiments, the capacitor can be charged up to a voltage of the buffered input (or a value close to the input node or a value of the first signal). In some cases, the charged value may include an offset, a noise, or a nonlinearity of the amplifier (e.g., the buffer, the buffered input).

In some embodiments, to reduce (e.g., remove) these non-idealities (e.g., from the buffer, the amplifier, etc.) in the charged value, the control circuitry can turn off the third switch and turn on the fourth switch. For example, by controlling the third switch and the fourth switch, the non-idealities from the buffer and/or the amplifier can be prevented from affecting the capacitor and/or charges therein. Because the capacitor has been pre-charged up to the voltage of the buffered input (e.g., already close to the first signal), by operating the third switch and the fourth switch (e.g., instead of operating the first switch), a small amount of charge can be driven from (or pushed back to) the input node to reduce (e.g., remove) the non-idealities, while preventing a surge between the input node and the first switch. In some embodiments, an impedance of the third switch and the fourth switch can be larger than an impedance of the first switch, which allows only a small amount of charge can move between the input node and the first switch. In some embodiments, a predetermined settling time may be given to reduce (e.g., remove) the non-idealities. For example, the settling time may be predetermined based on any of the components (e.g., the switches, the capacitor, the amplifier, etc.).

In some embodiments, the control circuitry can complete the charging of the capacitor by turning off the second switch. For example, the control circuitry can turn off the second switch according to a parameter (e.g., capacitance, resistance, a time constant of a resistor-capacitor (RC) circuit, etc.) associated with various circuit components (e.g., the capacitor, the switches, a resistor, etc.). The control circuitry can turn off the second switch at a predetermined timing. Such a timing may be predetermined according to any circuit component, including but not limited to, the capacitor, the switches, etc. In a non-limiting example, an on-resistance of a switch may be 10 k$\Omega$, and a capacitance of a capacitor may be 2 pF (or a circuit with a time constant of $\tau$=20 ns). When an initial voltage drop on the resistor at the beginning of a settling process is V0=50 mV, as the charges keep being dumped onto the capacitor, the voltage cross the resistor can keep decreasing (e.g., exponentially as a function of the time constant). For the voltage residual on the resistance at the end of the settling process to be less than, for example, 1 μV, the timing can be predetermined to be larger than, for example, 11τ (e.g., at least 220 ns). By turning off the second switch, the charge in the capacitor can be trapped. In some embodiments, the acquisition mode can be finished by turning off the second switch. In some embodiments, the trapped charge can be associated with the first signal (e.g., the input voltage). For example, the trapped charge can be proportional to the first signal (e.g., the input voltage). By trapping the charge, the amount of charge (and/or a sampled signal during an acquisition mode) can be prevented from being changed by operation of the switches or any change in status of the amplifier, the third switch or the fourth switch.

In some examples, charge generated by operating the second switch (e.g., turning off the second switch) can be dumped back to the input node, through the capacitor. In some embodiments, the second switch may be smaller than the first switch, and a small (e.g., smaller than the charge amount held in the capacitor) amount of charge can be generated and dumped back to the input node, through the capacitor, without causing a surge in charge or non-idealities in the acquisition value. In some embodiments, the second switch can be smaller than the first switch such that the first switch is a parallel array of a plurality of switches (e.g., 100 unit switches, 200 unit switches, etc.), and that the second switch is one switch (or two switches).

In some embodiments, the control circuitry can turn on the third switch and turn off the fourth switch. For example, the control circuitry can turn on the third switch and turn off the fourth switch with the second switch being off and the first switch being on. Since the charge in the capacitor is trapped, the turning on the third switch and the turning off the fourth switch may not change the amount of the charge in the capacitor or cause any charge to be pulled from the input node.

In some embodiments, the control circuitry can turn on the third switch and the turn off the fourth switch at various timings. For example, the control circuitry can provide another output signal from the amplifier to the ADC by, with the second switch being off, turning on the third switch and turning off the fourth switch. The control circuitry can provide the other output signal from the amplifier to the ADC, by turning on the first switch and turning off the second switch, turning on the third switch and turning off the fourth switch.

In some embodiments, the control circuitry can turn off the first switch. In some embodiments, a conversion mode can begin by turning off the first switch. Since the fourth switch is off, operating the first switch (e.g., turning off) may not affect the input node. Instead, charge generated by operating the first switch can be kicked back to the output of the buffer (e.g., the amplifier), rather than the input node. In some embodiments, a predetermined time can be given for the buffer (e.g., the amplifier) to settle the charge, thereby preparing for the next acquisition mode. In some embodiments, at the end of the conversion, the first switch and the second switch can be turned on to begin another acquisition mode (and thereby finishing the conversion mode). Since the third switch is on and the fourth switch is off, operating the first switch and the second switch may not affect the input node. Instead, charge generated by operating the first switch and the second switch can be kicked back to the output of the buffer (e.g., the amplifier).

In some embodiments, a first duration in which the first switch and the second switch are being turned on can be longer than a second duration in which the fourth switch is being turned on and the third switch is being turned off. In some embodiments, a first duration in which the first switch and the second switch are turned on to initiate charging of the capacitor can be longer than a second duration in which the fourth switch is turned on and the third switch is turned off to complete charging of the capacitor. In some embodiments, the control circuitry can set the first duration and the second duration such that the capacitor is charged to at least a voltage equal to a voltage of the first signal (or a voltage of the input node) and such that a noise due to at least one of offset, nonlinearity or distortion of the amplifier can be reduced.

Various embodiments disclosed herein are related to a system. The system includes an amplifier configured to receive a first signal, an analog-to-digital converter (ADC), a first switch coupled to a capacitor and configured to receive an output signal from the amplifier, the capacitor configured to provide, responsive to the first switch, the output signal as input to the ADC, a second switch coupled between the capacitor and the ADC and configured to turn on and off the ADC, a third switch coupled between an output of the amplifier and the first switch and configured to connect and disconnect the output signal to and from the first switch, a fourth switch coupled between an input of the amplifier and the first switch and configured to bypass the amplifier, and circuitry configured to: with the third switch being on and the fourth switch being off, turn on the first switch and the second switch to initiate charging of the capacitor, turn on the fourth switch and turn off the third switch, and then turn off the second switch to complete charging of the capacitor, and responsive to completing charging of the capacitor, then turn off the first switch to control the ADC to convert the output signal to a digital signal.

In some embodiments, the ADC includes a successive approximation register (SAR) ADC.

In some embodiments, each of the third switch and the fourth switch has an impedance that is larger than an impedance of the first switch.

In some embodiments, a first duration in which the first switch and the second switch are being turned on is longer than a second duration in which the fourth switch is being turned on and the third switch is being turned off.

In some embodiments, the circuitry is further configured to set the first duration and the second duration such that the capacitor is charged to at least a voltage equal to a voltage of the first signal and that a noise due to at least one of offset, nonlinearity or distortion of the amplifier is reduced.

In some embodiments, the circuitry is further configured to with the second switch being off, turn on the third switch and turn off the fourth switch to provide another output signal from the amplifier to the ADC.

In some embodiments, the circuitry is configured to with the first switch being on and the second switch being off, turn on the third switch and turn off the fourth switch to provide the other output signal from the amplifier to the ADC.

Various embodiments disclosed herein are related to a method. The method includes receiving, by an amplifier, a first signal, receiving, by a first switch coupled to a capacitor, an output signal from the amplifier, so that the capacitor provides, responsive to the first switch, the output signal as input to an analog-to-digital converter (ADC), with a third switch being on and a fourth switch being off, turning on the first switch and a second switch to initiate charging of the capacitor, wherein the second switch is coupled between the capacitor and the ADC and configured to turn on and off the ADC, the third switch is coupled between an output of the amplifier and the first switch and configured to connect and disconnect the output signal to and from the first switch, and the fourth switch is coupled between an input of the amplifier and the first switch and configured to bypass the amplifier, turning on the fourth switch and turning off the third switch, and then turning off the second switch to complete charging of the capacitor, and responsive to completing charging of the capacitor, turning off the first switch to control the ADC to convert the output signal to a digital signal.

In some embodiments, the ADC includes a successive approximation register (SAR) ADC.

In some embodiments, each of the third switch and the fourth switch has an impedance that is larger than an impedance of the first switch.

In some embodiments, a first duration in which the first switch and the second switch are being turned on is longer than a second duration in which the fourth switch is being turned on and the third switch is being turned off.

In some embodiments, the method includes setting the first duration and the second duration such that the capacitor is charged to at least a voltage equal to a voltage of the first signal and that a noise due to at least one of offset, nonlinearity or distortion of the amplifier is reduced.

In some embodiments, the method includes with the second switch being off, turning on the third switch and turn off the fourth switch.

In some embodiments, the third switch is turned on and the fourth switch is turned off with the first switch being on and the second switch being off.

Various embodiments disclosed herein are related to circuitry. The circuitry includes an amplifier configured to receive a first signal, a capacitor coupled to an output of the amplifier via a first switch, and coupled to an analog-to-digital converter (ADC) via a second switch, the capacitor configured to provide, responsive to the first switch, the output signal as input to the ADC, the second switch being configured to turn on and off the ADC, a third switch coupled between an output of the amplifier and the first switch and configured to connect and disconnect the output signal to and from the first switch, a fourth switch coupled between an input of the amplifier and the first switch and configured to bypass the amplifier, and a controller configured to: with the third switch being on and the fourth switch being off, turn on the first switch and the second switch to initiate charging of the capacitor, turn on the fourth switch and turn off the third switch, and then turn off the second switch to complete charging of the capacitor, and responsive to completing charging of the capacitor, turn off the first switch to control the ADC to convert the output signal to a digital signal.

In some embodiments, each of the third switch and the fourth switch has an impedance that is larger than an impedance of the first switch.

In some embodiments, a first duration in which the first switch and the second switch are being turned on is longer than a second duration in which the fourth switch is being turned on and the third switch is being turned off.

In some embodiments, the controller is configured to set the first duration and the second duration such that the capacitor is charged to at least a voltage equal to a voltage of the first signal and that a noise due to at least one of offset, nonlinearity or distortion of the amplifier is reduced.

In some embodiments, controller is configured to with the second switch being off, turn on the third switch and turn off the fourth switch to provide another output signal from the amplifier to the ADC.

In some embodiments, the controller is configured to with the first switch being on and the second switch being off, turn on the third switch and turn off the fourth switch to provide the other output signal from the amplifier to the ADC.

Embodiments in the present disclosure can provide solutions to the following problems. Operating an ADC (e.g., a capacitive SAR ADC) can involve switching activities of the switches during an acquisition mode. These activities can introduce a signal-dependent current at the input node. This current can be non-linear and/or sensitive to variations of the process, power supply, and temperature, while ranging from several hundred nano-amperes to tens of micro-amperes. This current can thereby result in a non-linear component during the acquisition value, undesirably affecting the performance of the ADC. Furthermore, these problems can often cause a cost-ineffective solution, thereby limiting the cost effectiveness of the ADC.

Techniques disclosed herein have at least the following advantages and benefits. In particular, the techniques disclosed herein provide improvements to ADCs configured to convert an analog signal into a digital signal, by repressing an input current. The techniques disclosed herein can repress the input current by incorporating a buffer (e.g., the amplifier) between the first switch and the input node and control the switches coupled to the buffer to isolate the input node from the switching operations of the switches. In some examples, the buffer and the switches coupled thereto can be controlled based on a predetermined timing control to avoid any negative impact the incorporated buffer/switches could have on the input and/or the ADC. For example, following the charging of the capacitor, by turning on the fourth switch and turning off the third switch, the charging of the capacitor can be complete with reduced non-linearity.

First, embodiments in the present disclosure can provide useful techniques for repressing the input current that stems from operations of the buffer and/or the switches, thereby preventing a non-linear component from affecting the amount of charge (and/or a sampled signal during an acquisition mode). This allows the ADC to output a reliable and accurate output signal, free from a non-linearity, enabling accurate and reliable operation of the ADC.

Second, embodiments in the present disclosure can provide cost-effective techniques for converting an analog signal into a digital signal with a reduced noise (e.g., a non-linearity). By incorporating a buffer (e.g., the amplifier) and switches (e.g., the third switch, the fourth switch, etc.) and performing a timing control of the same, the techniques disclosed herein can reduce the input current inherent in operations of the switches with a relatively simple design, thereby providing cost-effective solutions.

FIG. 1 is a schematic diagram of a traditional system 10. The traditional system 10 includes an ADC 150, a first switch SW1, a second switch SW2, a capacitor 102, and an input node $V_{IN}$. The ADC 110 can receive an analog signal from the input node $V_{IN}$, through the capacitor 102, and can convert the analog signal into a digital signal. The first switch SW1 and the second switch SW2 can operate (e.g., turn on/off) such that the capacitor 102 can be charted during an acquisition mode and the ADC can convert the analog signal into the digital signal. However, the operations of the first switch SW1 and the second switch SW2 can cause non-linear behavior (e.g., a noise, etc.) in the input node $V_{IN}$.

For example, charge generated due to the gate drop of the first switch SW1 and the second switch SW2 and/or charge from the channel of the first switch SW1 and the second switch SW2 can be pushed back to the input node $V_{IN}$, and can cause a non-linearity (e.g., a noise). This, in turn, can cause a non-linearity (e.g., a noise, etc.) in an acquisition value. In addition, since the capacitor 102 includes a plurality of capacitors, and the switch SW1 includes a plurality of switches SW1 to operate the ADC 150, the non-linear behavior (e.g., non-idealities, a noise, etc.) is not negligible and thus should be addressed. As discussed above, and discussed below with respect to FIG. 2A to FIG. 9, the third switch and the fourth switch (which can have an impedance that is larger than an impedance of the first switch) can reduce such a non-linear behavior.

Figure 2A:
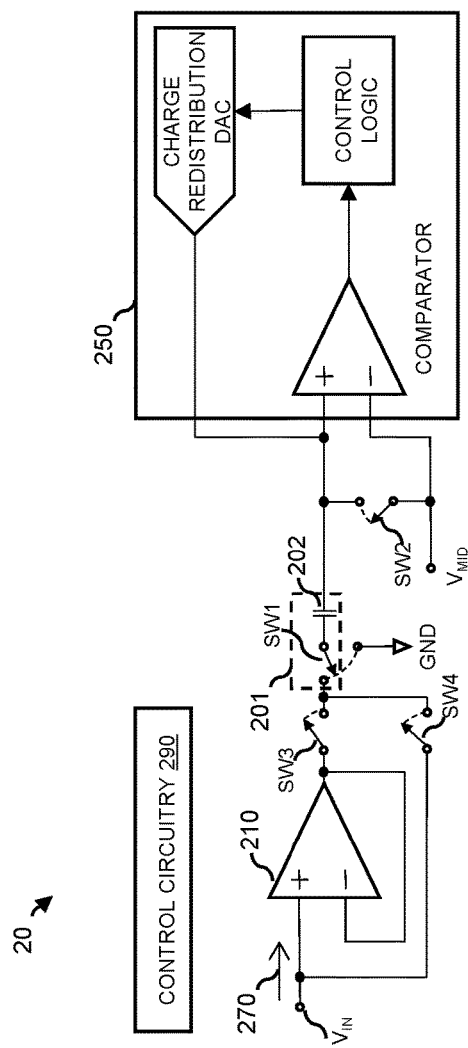
FIG. 2A is a schematic diagram of an example system in accordance with some embodiments.

FIG. 2A is a schematic diagram of an example system 20 in accordance with some embodiments. The system 20 can include various components to convert an analog signal into a digital signal. In some examples, the system 20 can include an amplifier 210, an input node $V_{IN}$, a capacitor 202, a first switch SW1, a second switch SW2, a third switch SW3, a fourth switch SW4 (collectively referred to as switches SW), control circuitry 290, and an ADC 250.

In some examples, the ADC 250 can convert a continuous analog signal into a digital representation or data for processing. In some embodiments, the ADC 250 may be or include a capacitive ADC and can convert an analog signal into a digital signal based on operations of switches (e.g., the switches SW) and a capacitor (e.g., the capacitor 202). For example, the capacitor 202 can be charged or discharged for the ADC 250 to perform the analog-to-digital conversion. In some embodiments, the ADC 250 may be or include a successive approximation register (SAR) ADC. The ADC 250 can iteratively approximate an input analog voltage to perform the analog-to-digital conversion. In some embodiments, the ADC 250 can successively compare an input voltage with a reference voltage, and can iteratively determine a closest approximation of the input voltage. In some embodiments, the ADC 250 can include a comparator, a control logic, a charge redistribution digital-to-analog converter (DAC), etc. For example, the ADC 250 can include a DAC configured to redistribute electric charges between different capacitors and output an analog voltage. The ADC 250 can include a DAC configured to generate an analog output voltage by redistributing charges across capacitors each of which corresponds to a digital input.

In some embodiments, the amplifier 210 may be or include an amplifier module, an operational amplifier, or any other component to receive an input signal and scale or adjust the input signal to a predetermined level. For example, the amplifier 210 can increase or decrease an amplitude of an input signal to a level corresponding to the ADC 250. In some embodiments, the amplifier 210 can receive a first signal 270 from the input node (e.g., input terminal) $V_{IN}$. In some embodiments, the amplifier 210 can serve as a buffer between the first switch SW1 and the input node $V_{IN}$. The first signal 270 may be or include an analog input signal, an analog input voltage, or any analog signal for the ADC 250 to generate a digital signal. The first signal 270 can be provided through the input node $V_{IN}$.

In some embodiments, each of the switches SW may be or include any semiconductor device (e.g., a BJT, a MOSFET, etc.), any semiconductor diode, any semiconductor switch, or any component that can control a current flow of a corresponding path that the switch is coupled to. Each switch can be open such that no current can flow through the corresponding path, and each switch can be closed such that a current can flow through the corresponding path.

In some embodiments, the first switch SW1 can be coupled to the capacitor 202 and can control a flow of an output signal from the amplifier 210. For example, when the first switch SW1 is on (e.g., closed), the first switch SW1 can receive an output signal from the amplifier 210 and send the output signal through the capacitor 202. When the first switch SW1 is off (e.g., open), the first switch SW1 can prevent the output signal from the amplifier 210 from flowing through the capacitor 202. The capacitor 202 can provide, responsive to the first switch SW1, the output signal as input to the ADC 250.

In some embodiments, the capacitor 202 may be or include any electronic component to store electrical energy. For example, the capacitor 202 can charge or discharge electric charge according to at least one of the switches SW. In some embodiments, the output signal may be or include a signal amplified by the amplifier 210. For example, the amplifier 210 can amplify the first signal 270, and the capacitor 202 can receive the first signal 270 that has been amplified by the amplifier 210 according to the first switch SW1. In some embodiments, the output signal may be or include an analog signal input to the ADC 250, which then can convert the input into a digital signal.

Figure 2B:
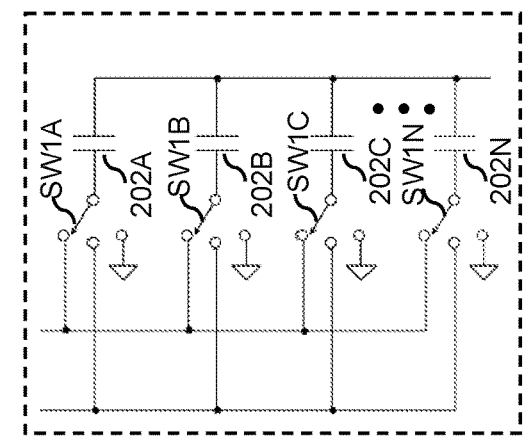
FIG. 2B is a schematic diagram of an example array of the first switch and the capacitor shown in FIG. 2A in accordance with some embodiments.

In some embodiments, the first switch SW1 and the capacitor 202 (collectively referred to as a pair 201) can be connected in series, and the pair 201 can be coupled in parallel to a plurality of pairs each of which includes a respective switch and a respective capacitor. That is, in some embodiments, the first switch SW1 may refer to a plurality of first switches, and the capacitor 202 may refer to a plurality of capacitors each of which is coupled to a corresponding one of the plurality of first switches. FIG. 2B is a schematic diagram of an example array 201A of the first switch SW1 and the capacitor 202 in accordance with some embodiments. In some embodiments, as shown, the first switch SW1 and the capacitor 202 may be or include an array of the first switches SW1 (e.g., SW1A, SW1B, SW1C, ... SW1N) and the capacitors 202 (e.g., 202A, 202B, 202C, ... 202N).

In some embodiments, the second switch SW2 can be coupled between the capacitor 202 and the ADC 250. The second switch SW2 can control an on/off status of the ADC 250. For example, the second switch SW2 can turn on the ADC 250 (e.g., when the second switch SW2 is on or closed). The second switch SW2 can turn off the ADC 250 (e.g., when the second switch SW2 is off or open).

In some embodiments, the third switch SW3 can be coupled between an output of the amplifier 210 and the first switch SW1. The third switch SW3 can control a connection between the first switch SW1 and the output signal of the amplifier 210. For example, the third switch SW3 can connect the output signal to the first switch SW1 (e.g., when the third switch SW3 is on or closed). The third switch SW3 can disconnect the output signal from the first switch SW1 (e.g., when the third switch SW3 is off or open).

In some embodiments, the fourth switch SW4 can be coupled between an input of the amplifier 210 and the first switch SW1. For example, the fourth switch SW4 can be coupled between an input terminal of the amplifier 210 and the first switch SW1. The fourth switch SW4 can be coupled between the input terminal and the first switch SW1. The fourth switch SW4 can control a connection between the input of the amplifier 210 and the first switch SW1. The fourth switch SW4 can connect the input of the amplifier 210 and the first switch SW1 (e.g., when the fourth switch SW4 is on or closed). The fourth switch SW4 can disconnect the input of the amplifier 210 and the first switch SW1 (e.g., when the third switch SW3 is off or open). In some embodiments, the fourth switch SW4 can bypass the amplifier 210 (e.g., cause an analog input signal to bypass the amplifier 210). In some embodiments, each of the third switch SW3 and the fourth switch SW4 can have an impedance that is larger than an impedance of the first switch SW1. For example, each of the third switch SW3 and the fourth switch SW4 can have an impedance that is larger than an impedance of the first switch SW1, regardless of an operating status (e.g., on/off) of the switches SW. As discussed in greater detail below, operating the third switch SW3 and the fourth switch SW4, after pre-charging the capacitor 202 allows for the capacitor 202 to be charged to at least a voltage equal to the first signal 270 such that a noise (e.g., due to at least one of offset, nonlinearity or distortion of the amplifier) can be reduced (e.g., removed).

In some embodiments, the system 10 can include the control circuitry 290. The control circuitry 290 may be or include a circuit, circuitry, a controller, or any component that can control at least one of the switches SW. For example, the control circuitry can be coupled to the switches SW to control an on/off status of the first switch SW1, second switch SW2, third switch SW3, or fourth switch SW4. The control circuitry 290 can control the switches SW in various modes. The control circuitry 290 can control the switches SW in an acquisition mode of the ADC 250 such that the ADC 250 can charge the capacitor 202 to sample an input analog signal (e.g., the first signal 270) to be converted to a digital signal. The control circuitry 290 can control the switches SW in a conversion mode of the ADC 250 such that the ADC 250 can convert the analog input signal (e.g., the first signal 270) to a digital output signal based on the charges in the capacitor 202. For example, in the conversion mode, a successive approximation can be used to convert the input analog signal (e.g., the first signal 270) to the digital output signal. The capacitor voltage can be compared to a reference voltage, sequentially being approximated to output the digital output signal. The control circuitry 290 can control the switches SW to operate alternately in the acquisition mode and the conversion mode.

Figure 3:
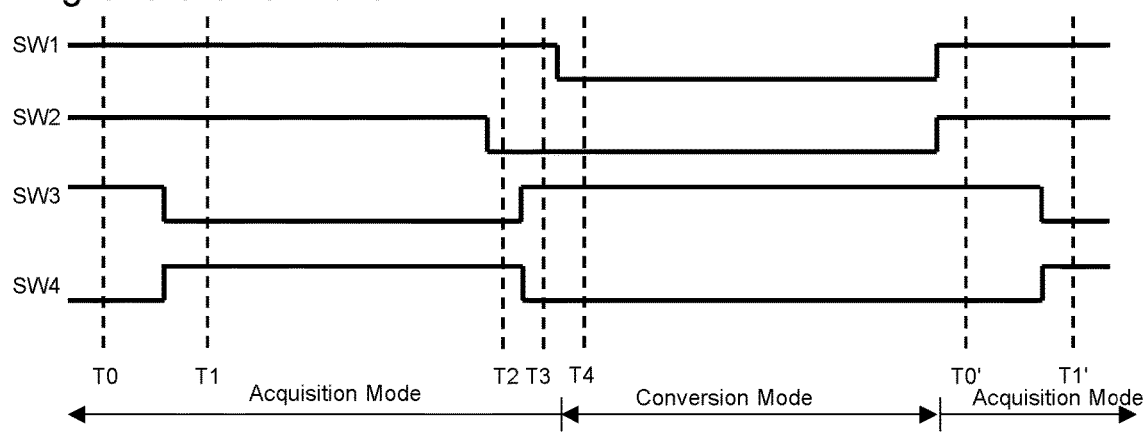
FIG. 3 is an example timing chart associated with operation of the system shown in FIG. 2A in accordance with some embodiments.

FIG. 3 is an example timing chart 30 associated with operation of the system 20 in accordance with some embodiments. Each of FIG. 4 to FIG. 8 is a schematic diagram of the system 20 at a certain time shown in the timing chart 30 in accordance with some embodiments. Referring to FIG. 3 to FIG. 8, discussed below is operation of the system 20 with respect to a timing control shown in the timing chart 30.

In some embodiments, at T0 (or prior to T0), referring to FIG. 4, the control circuitry 290 can initiate charging of the capacitor 202 by turning on the first switch SW1 and the second switch SW2 with the third switch SW3 being on and the fourth switch SW4 being off, thereby feeding a buffered input to the capacitor 202. In some embodiments, an acquisition mode can begin by turning on the first switch SW1 and the second switch SW2 with the third switch SW3 being on and the fourth switch SW4 being off. For example, as shown in FIG. 3, an acquisition mode can begin at around T0' when the first switch SW1 and the second switch SW2 are turned on. That is, the capacitor 202 can be charged by the first signal 270 that has passed the amplifier 210. In some embodiments, a predetermined time can be given to settle the capacitor 202 (e.g., charging up the capacitor 202). In some embodiments, the capacitor 202 can be charged up to a voltage of the buffered input (or a value close to the input node $V_{IN}$ or a value of the first signal 270). In some cases, the charged value may include an offset, a noise, or a nonlinearity of the amplifier 210 (e.g., the buffer, the buffered input).

In some embodiments, to reduce (e.g., remove) these non-idealities (e.g., from the buffer, the amplifier 210, etc.) from the charged value, at T1 (or prior to T1), referring to FIG. 5, the control circuitry 290 can turn off the third switch SW3 and turn on the fourth switch SW4. Because the capacitor 202 has been pre-charged up to the voltage of the buffered input (e.g., already close to the first signal 270), by operating the third switch SW3 and the fourth switch SW4 (e.g., instead of operating the first switch SW1), a small amount of charge can be driven from (or pushed back to) the input node $V_{IN}$ to reduce (e.g., remove) the non-idealities, while preventing a surge between the input node $V_{IN}$ and the first switch SW1. In some embodiments, an impedance of the third switch SW3 and the fourth switch SW4 can be larger than an impedance of the first switch SW1, which allows only a small amount of charge can move between the input node $V_{IN}$ and the first switch SW1. In some embodiments, a predetermined settling time may be given to reduce (e.g., remove) the non-idealities. For example, the settling time may be predetermined based on any of the components (e.g., the switches SW, the capacitor 202, the amplifier 210, etc.).

Figure 6:
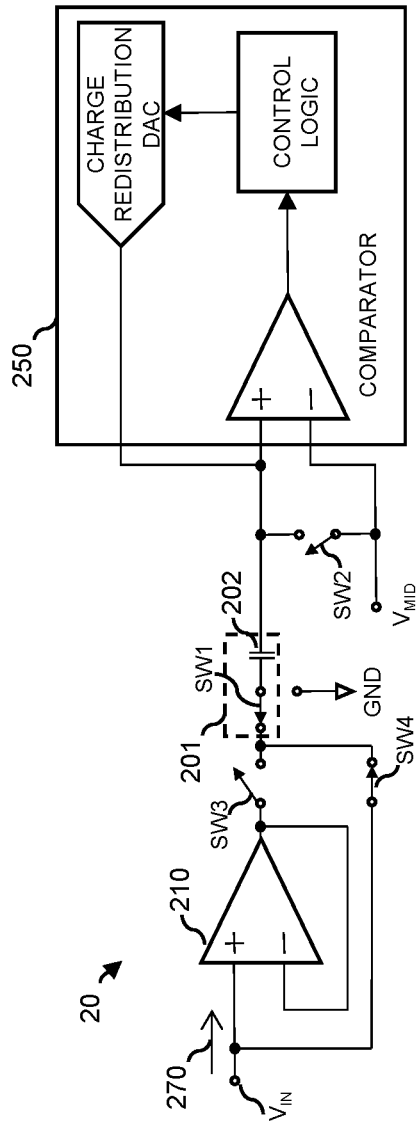

In some embodiments, at T2 (or prior to T2), referring to FIG. 6, the control circuitry 290 can complete the charging of the capacitor 202 by turning off the second switch SW2. For example, the control circuitry 290 can turn off the second switch SW2, according to a parameter (e.g., capacitance, resistance, a time constant of a resistor-capacitor (RC) circuit, etc.) associated with various circuit components (e.g., the capacitor 202, the switches SW, a resistor, etc.). The control circuitry 290 can turn off the second switch SW2 at a predetermined timing. Such a timing may be predetermined according to any circuit component, including but not limited to, the capacitor 202, the switches SW, etc. In a non-limiting example, an on-resistance of a switch may be 10 kΩ, and a capacitance of a capacitor may be 2 pF (or a circuit with a time constant of τ=20 ns). When an initial voltage drop on the resistor at the beginning of a settling process is V0=50 mV, as the charges keep being dumped unto the capacitor, the voltage cross the resistor can keep decreasing (e.g., exponentially as a function of the time constant). For the voltage residual on the resistance at the end of the settling process to be less than, for example, 1 μV, the timing can be predetermined to be larger than, for example, 11τ (e.g., at least 220 ns). By turning off the second switch SW2, the charge in the capacitor 202 can be trapped. In some embodiments, the acquisition mode can be finished by turning off the second switch SW2. For example, as shown in FIG. 3, at around T2, the acquisition mode can be finished by turning off the second switch SW2. In some embodiments, the trapped charge can be associated with the first signal 270 (e.g., the input voltage). For example, the trapped charge can be proportional to the first signal 270 (e.g., the input voltage). By trapping the charge, the amount of charge (and/or a sampled signal during an acquisition mode) can be prevented from being changed by operation of the switches SW or any change in status of the amplifier 210, the third switch SW3 or the fourth switch SW4.

In some examples, charge generated by operating the second switch SW2 (e.g., turning off the second switch SW2) can be dumped back to the input node $V_{IN}$, through the capacitor 202. In some embodiments, the second switch SW2 may be smaller than the first switch SW1, and a small (e.g., smaller than the charge amount held in the capacitor 202) amount of charge can be generated and dumped back to the input node $V_{IN}$, through the capacitor 202, without causing a surge in charge or non-idealities in the acquisition value. In some embodiments, the second switch SW2 can be smaller than the first switch SW1 such that the first switch SW1 is a parallel array of a plurality of switches (e.g., 100 unit switches, 200 unit switches, etc.), and that the second switch SW2 is one switch (or two switches).

Figure 7:
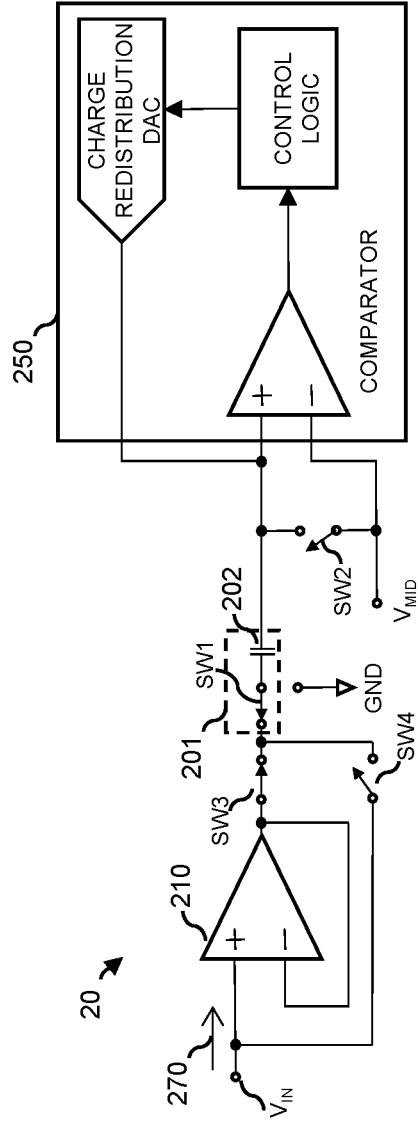

In some embodiments, at T3 (or prior to T3), referring to FIG. 7, the control circuitry 290 can turn on the third switch SW3 and turn off the fourth switch SW4. For example, the control circuitry 290 can turn on the third switch SW3 and turn off the fourth switch SW4 with the second switch SW2 being off and the first switch SW1 being on. Since the charge in the capacitor 202 is trapped, the turning on the third switch SW3 and the turning off the fourth switch SW4 may not change the amount of the charge in the capacitor 202 or cause any charge to be pulled from the input node $V_{IN}$. In some embodiments, the control circuitry 290 can turn on the third switch SW3 and the turn off the fourth switch SW4 at various timings. For example, the control circuitry 290 can provide another output signal from the amplifier 210 to the ADC 250 by, with the second switch SW2 being off, turning on the third switch SW3 and turning off the fourth switch SW4. The control circuitry 290 can provide the other output signal from the amplifier 210 to the ADC 250, by turning on the first switch SW1 and turning off the second switch SW2, turning on the third switch SW3 and turning off the fourth switch SW4.

Figure 8:
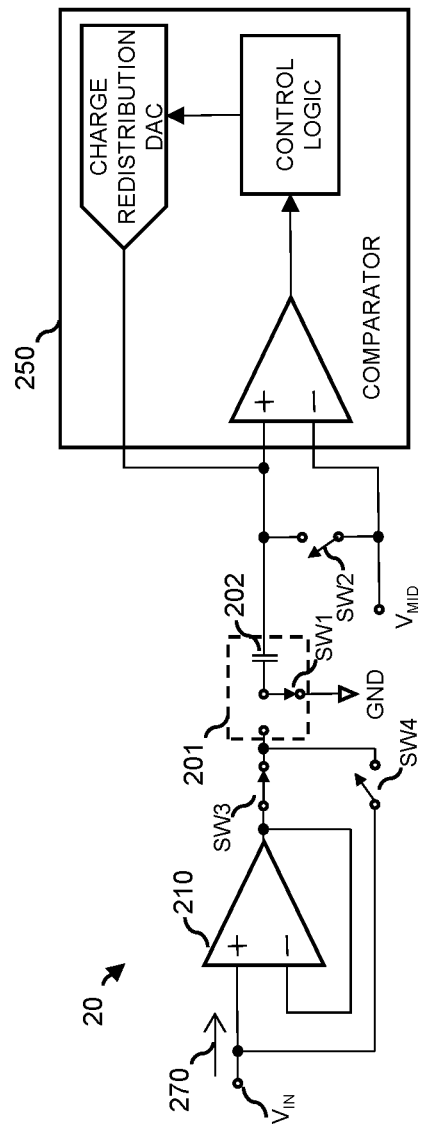

In some embodiments, at T4 (or prior to T4), referring to FIG. 8, the control circuitry 290 can turn off the first switch SW1. In some embodiments, a conversion mode can begin by turning off the first switch SW1. For example, as shown in FIG. 3, at around T3, the conversion mode can begin by turning off the first switch SW1. Since the fourth switch SW4 is off, operating the first switch SW1 (e.g., turning off) may not affect the input node $V_{IN}$. Instead, charge generated by operating the first switch SW1 can be kicked back to the output of the buffer (e.g., the amplifier 210), rather than the input node $V_{IN}$. In some embodiments, a predetermined time can be given for the buffer (e.g., the amplifier 210) to settle the charge, thereby preparing for the next acquisition mode. In some embodiments, at the end of the conversion (e.g., T0' or prior to T0'), the first switch SW1 and the second switch SW2 can be turned on to begin another acquisition mode (and thereby finishing the conversion mode). For example, as shown in FIG. 3, at around T0', the conversion mode can be finished and an acquisition mode can begin by turning on the first switch SW1 and the second switch SW2. Since the third switch SW3 is on and the fourth switch SW4 is off, operating the first switch SW1 and the second switch SW2 may not affect the input node $V_{IN}$. Instead, charge generated by operating the first switch SW1 and the second switch SW2 can be kicked back to the output of the buffer (e.g., the amplifier 210).

In some embodiments, as shown in FIG. 3, a first duration in which the first switch SW1 and the second switch SW2 are being turned on can be longer than a second duration in which the fourth switch SW4 is being turned on and the third switch SW3 is being turned off. In some embodiments, a first duration in which the first switch SW1 and the second switch SW2 are turned on to initiate charging of the capacitor 202 can be longer than a second duration in which the fourth switch SW4 is turned on and the third switch SW3 is turned off to complete charging of the capacitor 202. In some embodiments, the control circuitry 290 can set the first duration and the second duration such that the capacitor 202 is charged to at least a voltage equal to a voltage of the first signal (or a voltage of the input node $V_{IN}$) and such that a noise due to at least one of offset, nonlinearity or distortion of the amplifier can be reduced.

Figure 9:
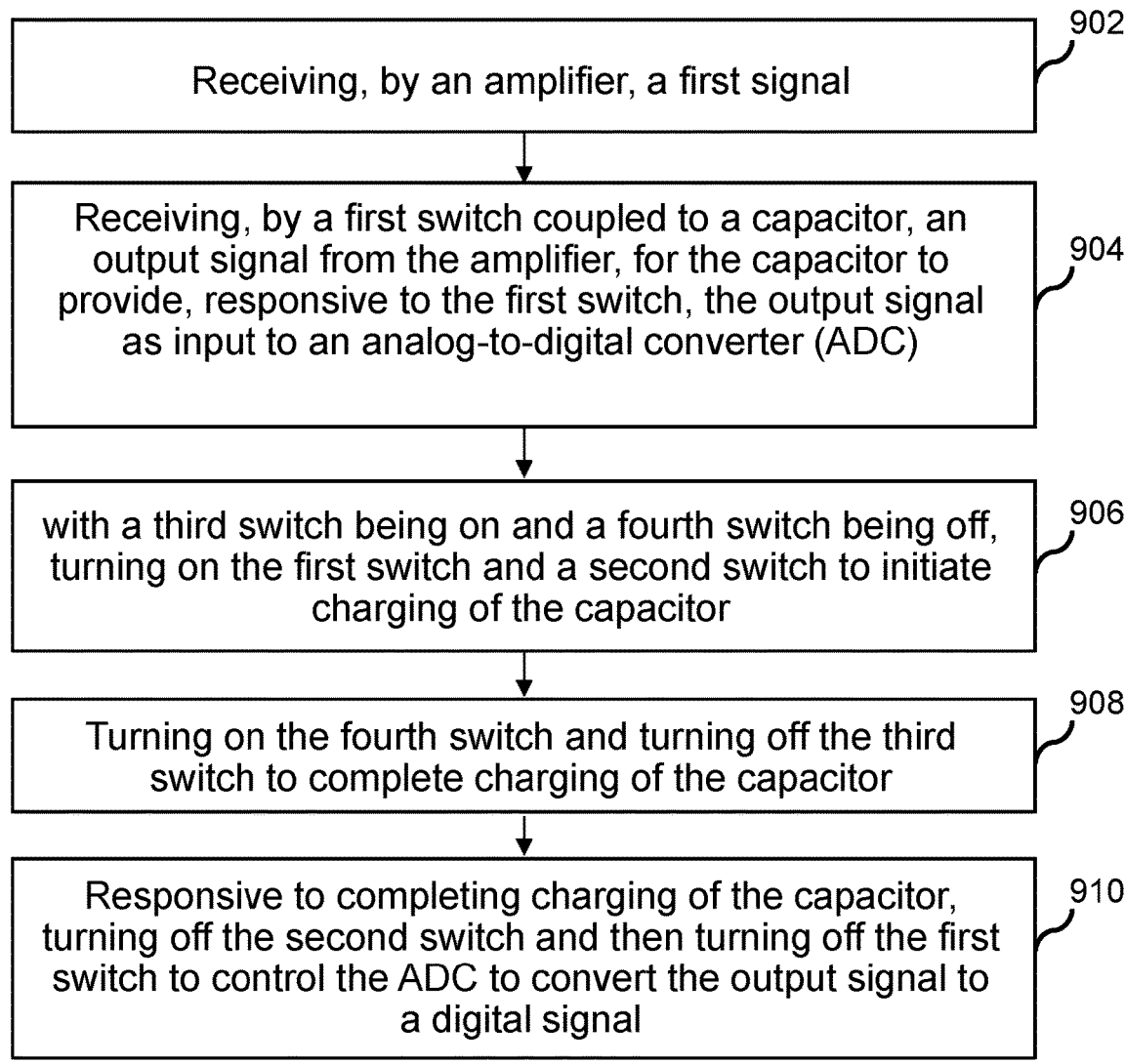
FIG. 9 is a flow diagram of an example process for operating the system shown in FIG. 2A in accordance with some embodiments.

FIG. 9 is a flow diagram of an example process 90 for operating the system 20 in accordance with some embodiments. In some embodiments, the process 90 can be performed by any of the device, system, or components thereof discussed above. For example, the process 90 can be performed using the control circuitry (e.g., the control circuitry 290) discussed with respect to FIG. 3 to FIG. 8. In other embodiments, the process 90 can be performed by other entities. In some embodiments, the process 90 can include more, fewer, or different steps than shown in FIG. 9.

At step 902, an amplifier (e.g., the amplifier 210 in FIG. 2A) can receive a first signal (e.g., the first signal 270 in FIG. 2A).

At step 904, in response to receipt of the first signal, a first switch (e.g., the first switch SW1 in FIG. 2A) coupled to a capacitor (e.g., the capacitor 202 in FIG. 2A), can receive an output signal from the amplifier, for the capacitor to provide, responsive to the first switch, the output signal as input to an analog-to-digital converter (ADC) (e.g., the ADC 250 in FIG. 2A).

At step 906, the first switch and a second switch (e.g., the second switch SW2) can be turned on to initiate charging of the capacitor, with a third switch (e.g., the third switch SW3 in FIG. 2A) being on and a fourth switch (e.g., the fourth switch SW4 in FIG. 2A) being off.

At step 908, the fourth switch can be turned on and the third switch can be turned off to complete charging of the capacitor.

At step 910, responsive to completing charging of the capacitor, the second switch can be turned off, and then the first switch can be turned off to control the ADC to convert the output signal to a digital signal.

The various circuitry and any other electronic and/or electrical components discussed herein can comprise a hardware component, a software component, a firmware component, and/or a combination thereof. The various circuitry and any other electronic and/or electrical components discussed herein to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. The term "coupled" and variations thereof may subsume the term "electrically coupled" and various thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system comprising:
   an amplifier configured to receive a first signal;
   an analog-to-digital converter (ADC);
   a first switch coupled to a capacitor and configured to receive an output signal from the amplifier, the capacitor configured to provide, responsive to the first switch, the output signal as input to the ADC;
   a second switch coupled between the capacitor and the ADC and configured to turn on and off the ADC;
   a third switch coupled between an output of the amplifier and the first switch and configured to connect and disconnect the output signal to and from the first switch;
   a fourth switch coupled between an input of the amplifier and the first switch and configured to bypass the amplifier; and
   circuitry configured to:
      with the third switch being on and the fourth switch being off, turn on the first switch and the second switch to initiate charging of the capacitor;
      turn on the fourth switch and turn off the third switch, and then turn off the second switch to complete charging of the capacitor; and
      responsive to completing charging of the capacitor, turn off the first switch to control the ADC to convert the output signal to a digital signal.

2. The system of claim 1, wherein the ADC comprises a successive approximation register (SAR) ADC.

3. The system of claim 1, wherein each of the third switch and the fourth switch has an impedance that is larger than an impedance of the first switch.

4. The system of claim 1, wherein a first duration in which the first switch and the second switch are being turned on is longer than a second duration in which the fourth switch is being turned on and the third switch is being turned off.

5. The system of claim 4, wherein the circuitry is further configured to set the first duration and the second duration such that the capacitor is charged to at least a voltage equal to a voltage of the first signal and that a noise due to at least one of offset, nonlinearity or distortion of the amplifier is reduced.

6. The system of claim 1, wherein the circuitry is further configured to:
   with the second switch being off, turn on the third switch and turn off the fourth switch to provide another output signal from the amplifier to the ADC.

7. The system of claim 6, wherein the circuitry is configured to:
   with the first switch being on and the second switch being off, turn on the third switch and turn off the fourth switch to provide the other output signal from the amplifier to the ADC.

8. A method, comprising:
receiving, by an amplifier, a first signal;
receiving, by a first switch coupled to a capacitor, an output signal from the amplifier, so that the capacitor provides, responsive to the first switch, the output signal as input to an analog-to-digital converter (ADC);
with a third switch being on and a fourth switch being off, turning on the first switch and a second switch to initiate charging of the capacitor, wherein the second switch is coupled between the capacitor and the ADC and configured to turn on and off the ADC, the third switch is coupled between an output of the amplifier and the first switch and configured to connect and disconnect the output signal to and from the first switch, and the fourth switch is coupled between an input of the amplifier and the first switch and configured to bypass the amplifier;
turning on the fourth switch and turning off the third switch, and then turning off the second switch to complete charging of the capacitor; and
responsive to completing charging of the capacitor, turning off the first switch to control the ADC to convert the output signal to a digital signal.

9. The method of claim 8, wherein the ADC comprises a successive approximation register (SAR) ADC.

10. The method of claim 8, wherein each of the third switch and the fourth switch has an impedance that is larger than an impedance of the first switch.

11. The method of claim 8, wherein a first duration in which the first switch and the second switch are being turned on is longer than a second duration in which the fourth switch is being turned on and the third switch is being turned off.

12. The method of claim 8, further comprising:
setting the first duration and the second duration such that the capacitor is charged to at least a voltage equal to a voltage of the first signal and that a noise due to at least one of offset, nonlinearity or distortion of the amplifier is reduced.

13. The method of claim 8, further comprising:
with the second switch being off, turning on the third switch and turn off the fourth switch.

14. The method of claim 13, wherein the third switch is turned on and the fourth switch is turned off with the first switch being on and the second switch being off.

15. Circuitry comprising:
an amplifier configured to receive a first signal;
a capacitor coupled to an output of the amplifier via a first switch, and coupled to an analog-to-digital converter (ADC) via a second switch, the capacitor configured to provide, responsive to the first switch, the output signal as input to the ADC, the second switch being configured to turn on and off the ADC;
a third switch coupled between an output of the amplifier and the first switch and configured to connect and disconnect the output signal to and from the first switch;
a fourth switch coupled between an input of the amplifier and the first switch and configured to bypass the amplifier; and
a controller configured to:
with the third switch being on and the fourth switch being off, turn on the first switch and the second switch to initiate charging of the capacitor;
turn on the fourth switch and turn off the third switch, and then turn off the second switch to complete charging of the capacitor; and
responsive to completing charging of the capacitor, turn off the first switch to control the ADC to convert the output signal to a digital signal.

16. The circuitry of claim 15, wherein each of the third switch and the fourth switch has an impedance that is larger than an impedance of the first switch.

17. The circuitry of claim 15, wherein a first duration in which the first switch and the second switch are being turned on is longer than a second duration in which the fourth switch is being turned on and the third switch is being turned off.

18. The circuitry of claim 15, wherein the controller is configured to set the first duration and the second duration such that the capacitor is charged to at least a voltage equal to a voltage of the first signal and that a noise due to at least one of offset, nonlinearity or distortion of the amplifier is reduced.

19. The circuitry of claim 15, wherein the controller is configured to:
with the second switch being off, turn on the third switch and turn off the fourth switch to provide another output signal from the amplifier to the ADC.

20. The circuitry of claim 19, wherein the controller is configured to:
with the first switch being on and the second switch being off, turn on the third switch and turn off the fourth switch to provide the other output signal from the amplifier to the ADC.

* * * * *